United States Patent [19]

Nishikawa

[11] 4,340,851
[45] Jul. 20, 1982

[54] POWERLESS STARTING CIRCUIT

[75] Inventor: Yukio Nishikawa, San Jose, Calif.

[73] Assignee: Precision Monolithics, Inc., Santa Clara, Calif.

[21] Appl. No.: 160,674

[22] Filed: Jun. 18, 1980

[51] Int. Cl.³ .............................................. G05F 3/16
[52] U.S. Cl. ................................... 323/311; 307/499; 307/571; 323/901
[58] Field of Search .............. 307/297, 491, 499, 503, 307/571, 581; 323/304, 311, 312, 901

[56] References Cited

U.S. PATENT DOCUMENTS 3,984,761 10/1976 Edington ......................... 323/901 X
4,009,432 2/1977 Dingwall et al. ................ 323/901 X
4,051,392 9/1977 Rosenthal et al. .............. 323/901 X

OTHER PUBLICATIONS

Ronald W. Russell and Thomas M. Frederiksen, "Automotive and Industrial Electronic Building Blocks", IEEE Journal of Solid-State Circuits, vol. SC-7, No. 6 Dec. 1972, pp. 446-454, and Particularly p. 450.
Paul R. Gray and Robert G. Meyer, "Analysis and Design of Analog Integrated Circuits", John Wiley and Sons, 1977, Appendix A4.2.

Primary Examiner—A. D. Pellinen
Attorney, Agent, or Firm—Richard S. Koppel

[57] ABSTRACT

An improved start-up circuit is provided for self-biased circuits of the type connected to a supply voltage and having biasing currents stable at two operating points at which the biasing currents are either zero or nonzero in value when the supply voltage is nonzero and having sufficient regenerative feedback to raise the level of the biasing currents to the nonzero value when an initial current is provided to the circuit. The start-up circuit includes a resistive element which provides a current path from the supply voltage to the self-biased circuit and a transistor element, responsive to the current flow through the path for supplying an initial current to the self-biased circuit, whereupon the regenerative feedback causes the circuit to draw a current related to the biasing current through the current path as the biasing currents reach the nonzero operating point. The current flow through the path causes the transistor element to disconnect the initial current from the self-biased circuit as the nonzero operating point is reached. The start-up circuit draws no power from the voltage supply after the disconnection occurs.

21 Claims, 8 Drawing Figures

POWERLESS STARTING CIRCUIT

FIELD OF THE INVENTION

The present invention, in general, relates to start-up circuits for self-biased linear integrated circuits, and, in particular, relates to start-up circuits which draw no power after the currents in the self-biased circuits have reached their desired operating levels.

BACKGROUND OF THE INVENTION

Many analog circuits are designed to be self-biased in order to provide independence from the variations in the supply voltage that energizes the circuit. However, such self-biased circuits often have a stable state in which zero current flows in the circuit even when the power supply voltage is nonzero. This occurs because at the instant the power is supplied, the currents in the bipolar transistors in the circuits are in the picoampere range. As is known, the current gain of these transistors at very low current levels is often less than unity. As a result, even with the power supply voltage at a nonzero value, the self-bias circuit is usually unable to drive itself out of the zero-current state. Accordingly, unless precautions are taken, the circuit may remain in this undesired zero-current condition, and consequently, the circuitry which it biases is also undesirably nonfunctional.

To avoid the zero-current conditions, separate start-up circuits are usually used with the self-biased circuits to inject an initial current into the circuits. Since self-biased circuits with zero-current and nonzero-current operating points have sufficient regenerative or positive feedback to bring the biasing currents in the circuit to the desired nonzero-current operating point, the initial injection of a relatively small current is sufficient to bring the biasing circuit to the desired operating point.

After the regenerative action of the self-biased circuit has initiated the movement of the biasing currents to the desired operating level, the starting circuit is no longer needed. Also, the start-up circuits must not interfere with the normal operation of the steady state biasing circuit currents once they have reached the desired operating point. Accordingly, start-up circuits are typically designed to automatically disconnect themselves from the biasing circuit as the desired operating point is reached.

While the start-up circuits found in the prior art generally provide sufficient starting current for the biasing circuit and adequately switch themselves out of the circuit once the desired operating point has been reached, they have several limitations. The start-up circuit is usually a series resistor-diode combination connected between the positive and negative supply terminals. The series resistor-diode combination is connected to the biasing circuit by another diode. The starting current flows through the connecting diode into the biasing circuit until it is biased off by the current buildup in the bias circuit. However, the use of a series resistor-diode combination, even when switched out of the circuit, results in the resistor dissipating power. This factor especially hurts the performance of a micropower circuit. Furthermore, the resistors used with this technique are typically of a large value and are implemented in integrated circuit form as an epitaxial resistor or a series of pinch resistors. Because of the large value and high breakdown voltage necessary for the series resistor, a large area on the chip is needed for this circuitry, even though it only used when power is first applied.

Accordingly, it is the principal object of the present invention to eliminate the power dissipated by a start-up circuit after it has injected the necessary starting current to a self-bias circuit.

It is another object of this invention to eliminate the large area on an integrated circuit die required by the resistive element of a start-up circuit.

A further object of this invention is to provide a relatively inexpensive start-up circuit.

Still another object of this invention is to provide a start-up circuit of the type which can be easily fabricated in integrated circuit form.

Still another object of this invention is to provide a start-up circuit which does not affect the steady-state values of the currents in a biasing circuit to which it is connected after it has supplied a starting current to that circuit.

SUMMARY OF THE INVENTION

The present invention, in a broad aspect, provides an improved start-up circuit for self-biased circuits of the type connected to a supply voltage and having biasing currents stable at two operating points at which the biasing currents are either zero or nonzero in value when the supply voltage is nonzero, and having sufficient regenerative feedback to raise the level of the biasing currents to the nonzero value when an initial current is provided to the self-biased circuit.

The start-up circuit includes a resistive element which provides a current path from the supply voltage to the self-biased circuit and a transistor element. The transistor element is responsive to the flow of current through the path and supplies an initial current to the self-biased circuit, whereupon the regenerative feedback causes the circuit to draw a current related to the biasing currents through the current path as the biased currents reach their nonzero operating points. The current flow through the path causes the transistor element to shut off the initial current to the self-biased circuit as the nonzero operation point is reached, thereby effectively disconnecting the start-up circuit from the biasing circuit. The transistor element draws no power from the voltage supply after the disconnection has occurred. Also, the starting circuit of the present invention can be fabricated in a much smaller area than the starting circuits shown in the prior art.

In accordance with one feature of the invention, the transistor element is a field effect transistor having a gate terminal connected to the supply voltage, a source terminal coupled through the resistive element to the supply voltage and also connected to the self-biased circuit, and a drain terminal connected to the self-biased circuit. The field effect transistor is initially biased in the "on" state, whereby the starting current flows through the channel of the field effect transistor to the bias circuit. The regenerative action of the self-biased circuit causes the current related to the biasing currents to flow through the resistive element thereby causing a voltage drop across the resistor which, in turn, biases the transistor "off" when it reaches the level of the pinch-off voltage. The biasing off of the FET effects the disconnection of the start-up circuit from the self-biased circuit.

In accordance with another feature of the invention, the field effect transistor may be an N-channel JFET; a P-channel JFET; an N-channel MOSFET; or a P-channel MOSFET. The JFETs may be of the epitaxial, diffused, or implanted variety. Similarly, the MOSFETs may utilize any of the common constructions such as MIS, silicon gate, etc., with the only requirement being that they conduct current when the gate and source terminals are at nearly equal voltages.

In accordance with another feature of the invention, the resistive element may be implemented as a resistor on an integrated circuit die. The resistive element may be a base resistor, a base pinch resistor, an epitaxial resistor, or an epitaxial pinch resistor. The resistive element may also be implemented as a thin film resistor.

Other objects, features, and advantages of the present invention will become apparent from a consideration of the following detailed description and from the accompanying drawings.

DETAILED DESCRIPTION

Figure 1:
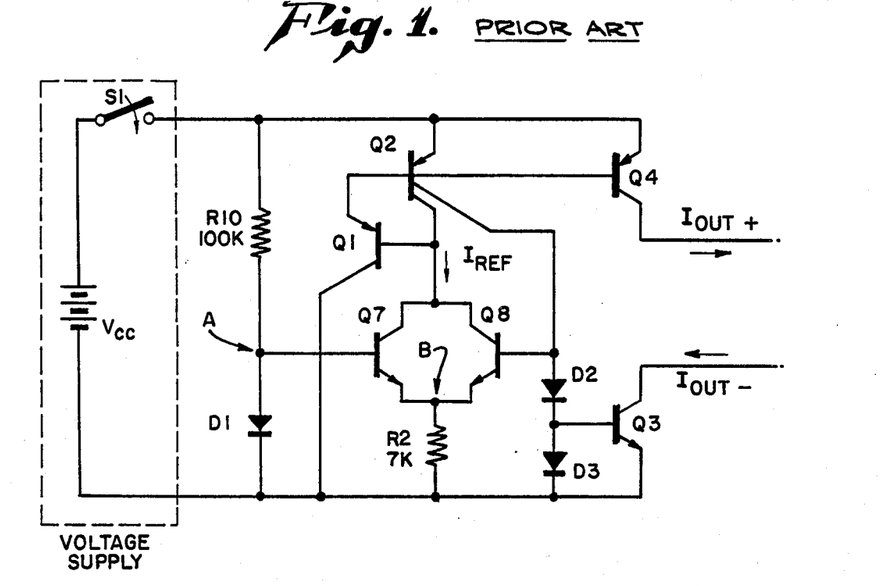
FIG. 1 is a schematic diagram of a prior art start-up circuit.
Figure 2:
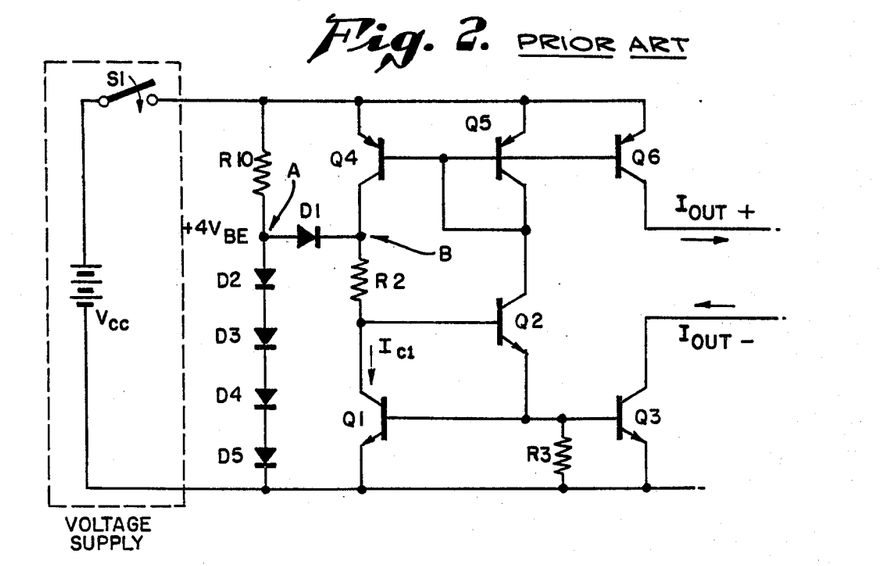
FIG. 2 is a schematic diagram of another prior art start-up circuit.

Referring more particularly to the drawings, FIGS. 1 and 2 show prior art versions of start-up circuits for self-biased circuits of the type connected to a voltage supply and having biasing currents stable at two operating points at which the biasing currents are either zero or nonzero in value when the supply voltage is nonzero. In FIGS. 1 and 2, as in FIGS. 3, 4, 5, 7 and 8, the voltage supply has been shown diagrammatically as a battery connected to an open switch S1 which is about to close. It is to be understood that this configuration is merely representative of the electronic power supplies used to energize the circuitry.

FIG. 1 is typical of the prior art start-up circuits used widely in the semiconductor industry. The start-up circuit in FIG. 1 comprises resistor R10, diode D1, and transistor Q7. The remainder of the circuitry in FIG. 1 comprises a bias regulator circuit which provides biasing currents $I_{OUT+}$ and $I_{OUT-}$ for other circuitry connected thereto. The bias circuitry in FIG. 1 is designed to be independent of fluctuations in the supply voltage $V_{CC}$ once the proper operating currents have been established. When the proper operating currents are established, the voltage across resistor R2 is approximately one forward diode voltage drop, which establishes a reference current $I_{REF}$ that is independent of $V_{CC}$ thereby providing the circuit with its self-biasing characteristic. However, without the start-up circuit R10, D1 and Q7, the initial application of voltage, by the closure of switch S1 would not necessarily establish the proper operating currents for the biased circuit because circuits of the type shown in FIGS. 1 and 2 have a stable operating point in which zero current flows in the circuit even when the supply voltage is nonzero. This condition occurs because, when the supply voltage is first applied, the currents in the transistors are very small, often in the picoampere range. Furthermore, as the current gain of the transistors at very low currents is often less than unity, the circuit is usually unable to drive itself out of the zero current state. Therefore, without the start-up circuit, the circuit would continue to be in the undesired zero-current state.

The start-up circuit of FIG. 1 composed of resistor R10, diode D1, and transistor Q7 injects an initial starting current into the circuit so that the circuit can begin to operate, thereby preventing the gain of the transistors from falling to the very low value discussed above. Furthermore, after injecting this current, the start-up circuit of FIG. 1 disconnects itself from the biasing circuitry so as not to interfere with its normal operation once it has reached the desired operating point.

Regarding the operation of the start-up circuit in FIG. 1, when power is applied to the circuit, the current through resistor R10 turns transistor Q7 on. In turn, Q7 forces current to be mirrored through transistors Q1 and Q2 to diode D2 and D3, thereby turning on transistor Q8. When the steady state is reached, the emitter of Q7, at node B, which is also connected to resistor R10, is biased at one $V_{BE}$ (approximately equal to one forward-biased diode drop). Similarly, the base of transistor Q7, at node A, is biased at one $V_{BE}$ by diode D1. Accordingly, transistor Q7 is off. Since transistor Q7 is off, the start-up circuit composed of R10, D1 and Q7 is effectively disconnected from the activated biased circuit. Therefore, the initial injection of current, via R10 and Q7, into Q1 starts a regenerative process by which Q8 is turned on and Q7 is turned off. As a result, the positive feedback present in the circuit of FIG. 1 only requires the injection of a very small current by resistor R10 and transistor Q7 to allow the circuit to bring itself to its proper operating point.

FIG. 2 shows another prior art version of a start-up circuit connected to a biasing circuit. In FIG. 2, the start-up circuit is composed of resistor R10, and diodes D1–D5. The operation of the start-up circuit can be explained by assuming the circuit of FIG. 2 is initially in the undesired zero-current state. Then, the voltage at the base of transistor Q1 is at ground. The voltage at the base of transistor Q2 is then tens of millivolts above ground, as determined by the leakage currents in the circuit. However, the voltage at node A is four diode drops above ground ($+4V_{BE}$), so that a voltage of approximately three diode drops appears across resistor R2 and a current flows through resistor R2 into the Q1–Q2 transistor configuration. This causes a current to flow in Q4 and Q5, avoiding the zero-current state.

After the bias circuit drives itself to the desired stable state, the start-up circuit must not effect the steady-state current values. In FIG. 2, this accomplished by causing resistor R2 to be large enough so that when the steady-state current is established in Q1, the voltage drop across R10 is large enough to reverse-bias diode D1. In the steady-state, therefore, the voltage at node B is two diode drops plus $(I_{C1})(R2)$ above ground and the voltage at node A is four diode drops above ground. Thus, if $(I_{C1})(R2)$ is made equal to two diode drops, D1 will have zero voltage across it in the steady state, thereby disconnecting the start-up circuit from the biasing circuit.

The prior art circuits shown in FIGS. 1 and 2 have two primary disadvantages. First, resistor R10 in FIGS.

1 and 2 must have relatively large values, on the order of 100K ohms. As such resistors are typically implemented on an integrated circuit die as an epitaxial resistor, a series of pinch resistors, or a high-valued base resistor, usually occupy a large area on a chip. Furthermore, even when the start-up circuit is disconnected from the bias circuit, these resistors continue to dissipate power, which especially hurts the performance of micropower circuits requiring such start-up circuits. These disadvantages are overcome by the present invention which uses a field effect transistor to inject the initial current. The transistor switches itself out after the current has reached a steady state and does not consume any power nor occupy a large chip area.

Figure 3:
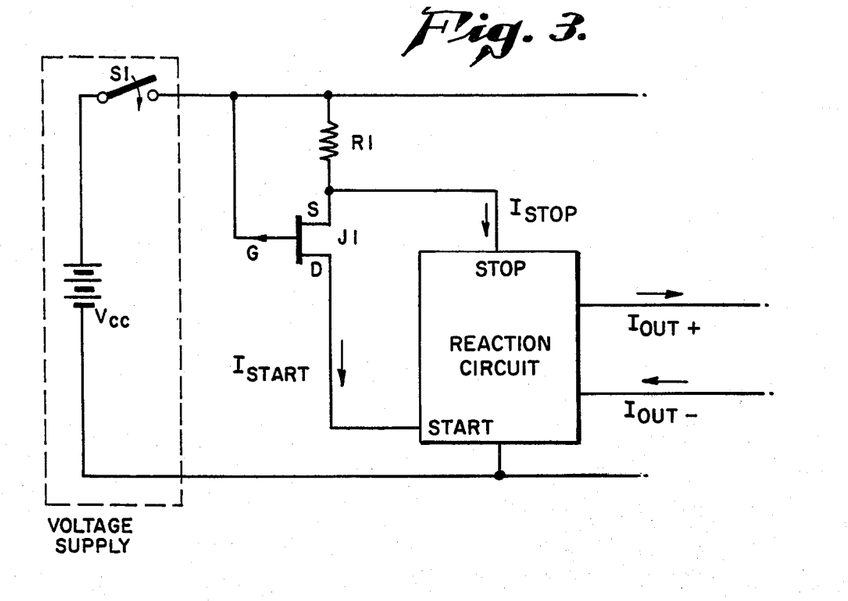
FIG. 3 is a schematic diagram of one embodiment of a start-up circuit according to the present invention.
Figure 4:
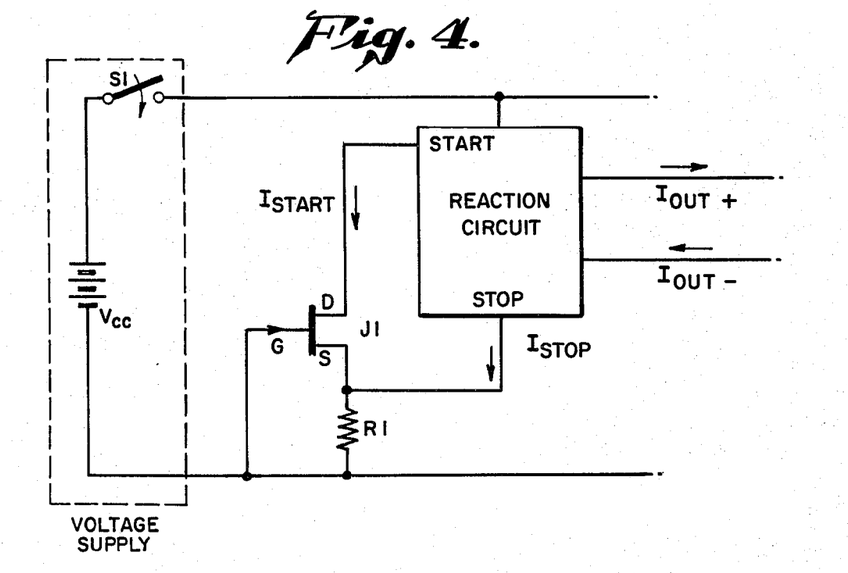
FIG. 4 is a schematic diagram of another embodiment of a start-up circuit according to the present invention.

FIGS. 3 and 4 show two alternate embodiments of a start-up circuit according to the present invention. FIGS. 3 and 4 are identical, except that FIG. 3 is configured for a P-channel Junction Field Effect Transistor (JFET) J1, while FIG. 4 is configured for an N-channel JFET J1. In both circuits, the voltage supply is again shown diagrammatically as a battery connected to a switch S1. The bias circuit to which the start-up circuit is connected is shown as a Reaction circuit which has injected into it an initial starting current $I_{START}$ and which draws a stop current $I_{STOP}$. The Reaction circuit in both FIGS. 3 and 4 is shown supplying output currents $I_{OUT+}$ and $I_{OUT-}$, which are typically biasing currents for other circuitry connected to the Reaction circuit.

In operation, when power is applied (symbolically shown as the closure of the switch) to the circuitry shown in FIGS. 3 or 4, transistor J1 starts conducting the Start current into the Reaction circuit, the precise point of injection usually being the base of a transistor in the Reaction circuit. When the Reaction circuit then becomes active, it begins to draw the Stop current by virtue of its inherent regenerative or positive feedback. This Stop current then biases transistor J1 off. Therefore, after starting, J1 is switched off and does not dissipate any power.

The only design criteria for the circuit shown in FIGS. 3 and 4 are that resistor R1 be greater than or equal to the pinch-off voltage divided by the Stop current and that the Reaction circuit be regenerative so that it can sustain the Stop current after transistor J1 is switched off. The Stop current may be drawn by the Reaction circuit at any convenient location and need not be drawn by a specific element dedicated to that purpose.

The novel features of the present invention are possible because of the basic nature of a field effect transistor. That is, the FET, because it is a unipolar device, is normally in the "on" state until the channel of the FET is pinched off by a reverse gate-to-source voltage that removes all of the free charge from the channel. When in the "on" state, the resistance of the FET can be in the 100-ohm range, while its off resistance can be in the 100-meg ohm range. Thus, the FET has a low on resistance until it is biased "off", whereupon it has a very high resistance. By contrast, a bipolar transistor is a normally "off" device which must be biased "on". Thus, whenever an all-bipolar approach is taken in a start-up circuit, a direct path between the positive and negative supply voltage terminals is needed to provide a starting current, which requires the use of the large-valued resistor which will always consume power and occupy a large area.

Therefore, and referring again to either FIG. 3 or FIG. 4, transistor J1 is in the "on" state when power is first applied and is switched to the "off" state as the Reaction circuit draws sufficient Stop current as it reaches the proper operating point. The purpose of resistor R1, which is connected to the source terminal of transistor J1, is to provide a current path to the reaction circuit from the supply voltage such that a sufficient bias will be developed across the gate and source terminals of transistor J1 to bias transistor J1 to the "off" state when a sufficient amount of Stop current flows to indicate that the internal currents in the Reaction circuit have reached their desired operating point.

Resistor R1 need only meet the criteria previously mentioned and is typically on the order of several thousand ohms. As a result, when power is first applied to the circuit in FIGS. 3 or 4, the Reaction current draws a negligible amount of Stop current, thereby producing only a negligible voltage drop across resistor R1. This places the gate and source terminals at approximately the same potential, maintaining transistor J1 in the "on" state. Transistor J1 thus supplies the starting current $I_{START}$ to the Reaction circuit. As the regenerative feedback of the Reaction circuit brings the internal biasing currents to the proper operating point, more current begins to flow through R1 to develop a sufficient voltage drop across R1 to bias the source terminal relative to the gate terminal such that transistor J1 is turned off. When transistor J1 is off, no starting current flows to the Reaction circuit. Accordingly, J1 does not consume any power after the Reaction circuit has reached steady state. Although resistor R1 dissipates a small amount of power, that power would have been dissipated by the self-biased circuit had R1 not been present as in FIGS. 1 and 2. That is, there is no additional power dissipation with the addition of R1. Hence, the start-up circuit appears to dissipate no power when compared to that of the prior art in FIGS. 1 and 2.

Resistor R1 in FIGS. 3 and 4 can be implemented in several different ways. It may be either an active or passive resistor. If a passive resistor configuration is used, R1 may be implemented as a base resistor, a base pinch resistor, an epitaxial resistor, or as an epitaxial pinch resistor in an integrated circuit substrate. It may also be implemented as a thin film resistor. If an active configuration is used, R1 may be replaced by a junction field effect transistor (JFET) or as a metal-oxide-semiconductor field effect transistor (MOSFET).

Similarly, transistor J1 may be implemented in different ways. For example, it may be either a P-channel JFET as shown in FIG. 3, or an N-channel JFET as shown in FIG. 4. The JFETs may be of either the epitaxial, diffused, or implanted variety. N-channel or P-channel MOSFETs may also be used for J1. The only requirement for the particular device chosen is that it conduct current when the gate and source are at nearly equal voltages. Also, regardless of the particular configuration of R1 and J1 used, only a small chip area will be required.

Figure 5:
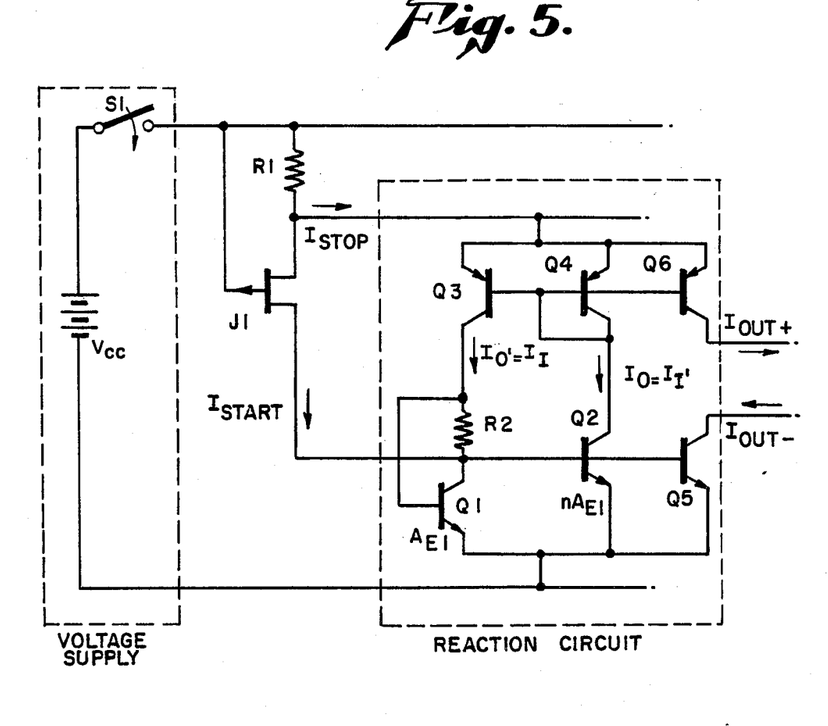
FIG. 5 is a schematic diagram of one application of the start-up circuit shown in FIG. 3.
Figure 6:
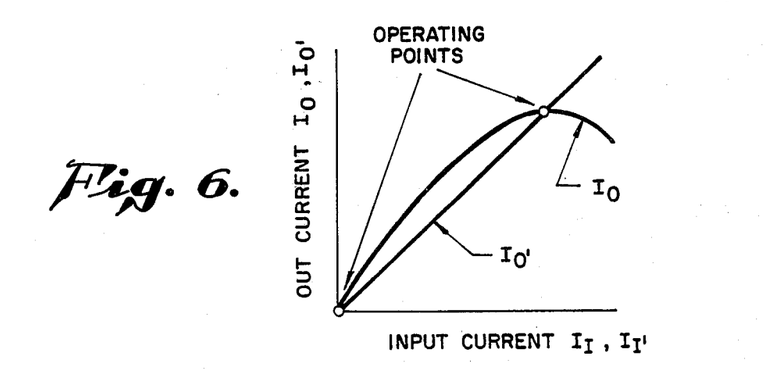
FIG. 6 is a graph showing the currents in the circuit shown in FIG. 5.
Figure 7:
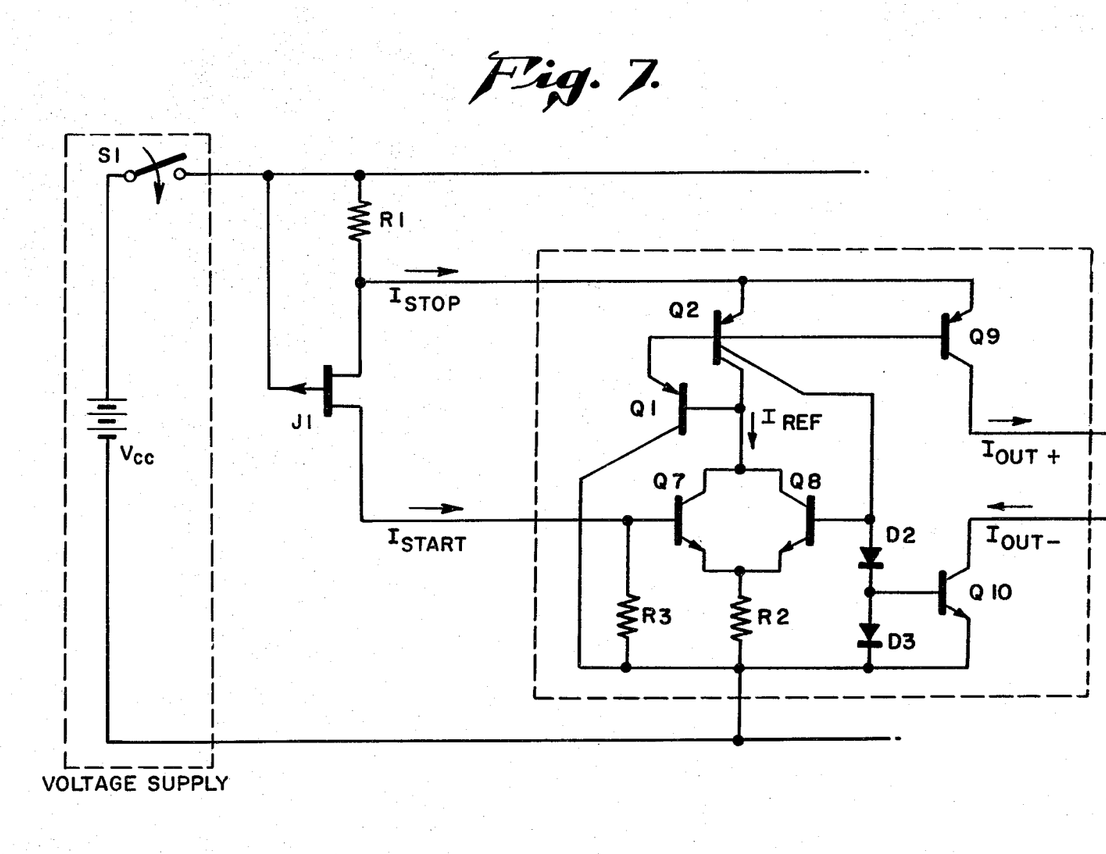
FIGS. 7 and 8 are schematic diagrams two other applications of the start-up circuit shown in FIG. 3.
Figure 8:
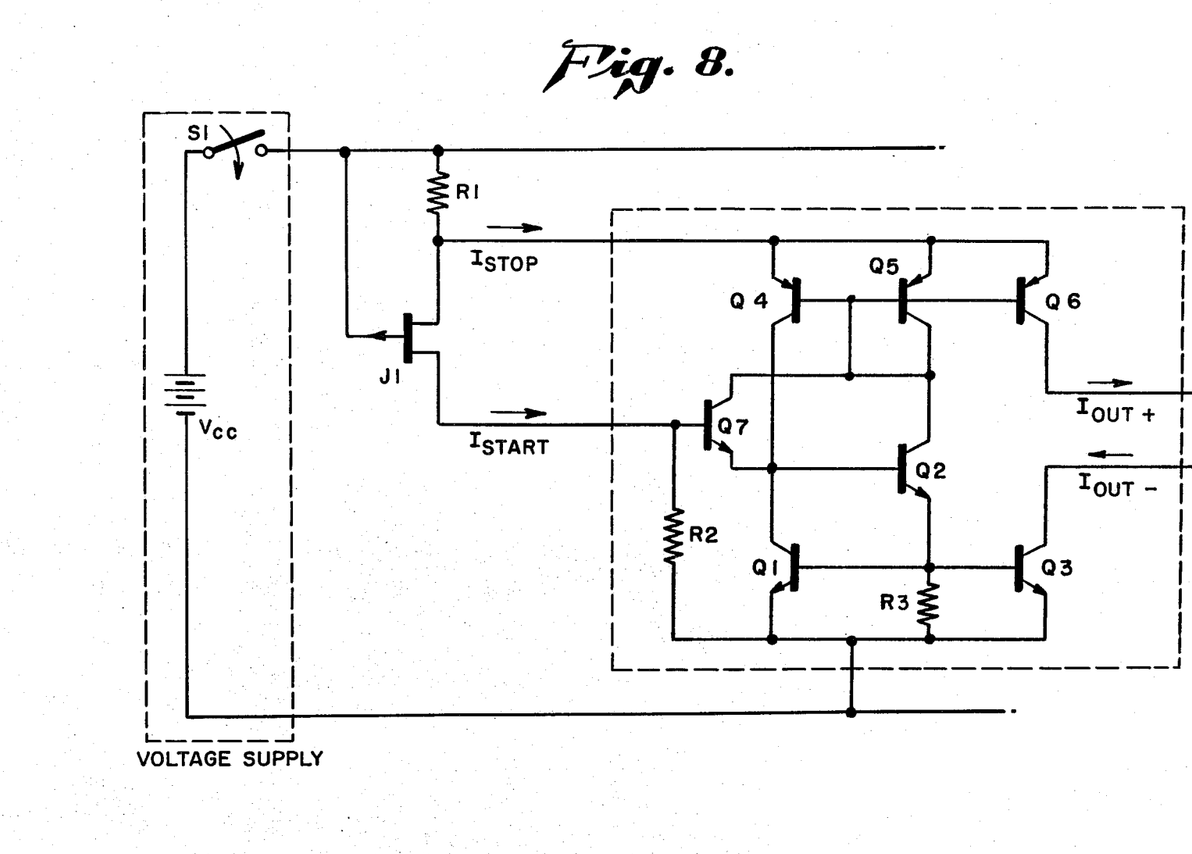

The Reaction circuit shown diagrammatically in FIGS. 3 and 4 is typically two current sources placed back-to-back and configured such that they are regenerative up to the useful operating point. One current source may be a peaking current source or any other nonlinear-current gain, current source, with the other being a current turn-around. FIGS. 5, 7 and 8 show three specific applications of the present invention. FIG. 5 shows the start-up circuit of the present invention used to start a back-to-back latching current source. FIG. 6 shows the potential operating points for the currents in the circuit. Specifically, FIG. 6 shows that current $I_0$ and current $I_0'$ have a stable operating point at the origin of the graph and at their intersection in the upper right hand region of the graph. Therefore, when power is first applied, the currents $I_0$ and $I_0'$ will remain at zero until an initial starting current is applied, whereupon the regenerative action of the circuit will bring them to the upper operating point. The start-up circuit comprising J1 and R1 injects an initial current to the base of transistor Q2 which starts Q2 conducting current, which is then mirrored by transistor Q4 into transistor Q3. The collector current of Q3 then forces Q1 to conduct. Regeneration occurs because the emitter area of Q2 ($nA_{E1}$) is n times as large as that of Q1 ($A_{E1}$) (see FIG. 5). The current flowing through Q2 thus has a value of n times the value of the current flowing through Q1. When the current reaches the steady state, the voltage drop across R2 reduces this current gain $I_O/I_I$ to one and the currents in the circuit are those of the upper operating point. Transistors Q3 and Q4 draw Stop current through resistor R1, which then causes transistor J1 to be biased "off". In their stable states, the latching current sources formed by transistors Q1 and Q3 and transistors Q2 and Q4 have their output currents, $I_O'$ and $I_O$, respectively, at the upper operating point on the graph shown in FIG. 6.

The Reaction circuit may also be an SCR, or a bias circuit of the types shown in FIGS. 1 and 2. FIGS. 7 and 8 respectively show the bias circuits of FIGS. 1 and 2 configured as Reaction circuits and connected to the start-up circuit of the present invention. The only requirements for the reaction circuit is that it be regenerative with two stable states and that it be able to draw a stop current to bias the FET off.

With these different configurations for the Reaction circuit, the novel circuit of the present invention has many applications. For example, it may be used in a power-on or event indicator using the SCR as a switch; a delay timer measuring the time from the occurrence of an event; a circuit to set the initial state in multivibrators; a one-shot multivibrator; or as part of a free-running oscillator.

In the foregoing description of the present invention, a preferred embodiment and several alternative embodiments of the the invention have been disclosed. It is to be understood that other design variations are within the scope of the present invention. Thus, by way of example and not of limitation, active devices providing equivalent characteristics to a field effect transistor, such as combination bipolar/MOSFET devices, could be substituted for the field effect transistor to supply the Start current to the Reaction circuit; means other than a resistor could be used as load for the field effect transistor to supply a path for the Stop current to the Reaction circuit; and the Stop current drawn by the Reaction circuit after start-up may be any convenient current in the Reaction circuit which increases in value as the regenerative action of the reaction circuit brings it to its proper operation point. Accordingly, the invention is not limited to the particular arrangement which has been illustrated and described in detail herein.

What is claimed is:

1. An improved start-up circuit for a bias circuit connected to a supply voltage and having biasing currents independent of said voltage but stable at either zero or nonzero values when said supply voltage is nonzero, and also having sufficient regenerative feedback to raise the level of said biasing current to said nonzero stable value in response to only a slightly nonzero starting current injected into said bias circuit, said start up circuit comprising:

field effect transistor means, having gate means connected and source means coupled to said supply voltage and having drain means and said source means connected to said bias circuit, for injecting a starting current of small value relative to said nonzero value through said drain means into said bias circuit and for disconnecting said starting circuit from said bias circuit;

resistor means, connected between said supply voltage and said source means, providing a path from said supply voltage to said bias circuit for a current related to said biasing current level; and     said field effect transistor means being responsive to said related current whereby said injection of starting current into said bias circuit causes said feedback to raise said level of said biasing currents to said nonzero value and thereby initiate the flow of said related current through said resistor means, whereupon said field effect transistor means effects said disconnection, with said start-up circuit drawing no power from said voltage supply after said disconnection.

2. A start-up circuit as defined in claim 1, wherein said field effect transistor means comprises:

a field effect transistor, including a gate terminal connected to said supply voltage, a source terminal coupled through said resistor means to said supply voltage and connected to said bias circuit, and a drain terminal connected to said bias circuit, said field effect transistor means being initially biased in the ON state whereby said starting current flows through the channel of said field effect transistor to said bias circuit, said flow of said related current thereafter biasing said field effect transistor to the OFF state and effecting said disconnection.

3. A start-up circuit as defined in claim 2, wherein said field effect transistor comprises:

a N-channel junction field effect transistor.

4. A start-up circuit as defined in claim 2, wherein said field effect transistor comprises:

a P-channel junction field effect transistor.

5. A start-up circuit as defined in claim 2, wherein said field effect transistor comprises:

a N-channel metal-oxide-semiconductor field effect transistor.

6. A start-up circuit as defined in claim 2, wherein said field effect transistor comprises:

a P-channel metal-oxide-semiconductor field effect transistor.

7. A start-up circuit as defined in claims 3 or 4 wherein said field effect transistor is of the epitaxial type.

8. A start-up circuit as defined in claims 3 or 4 wherein said field effect transistor is of the diffused type.

9. A start-up circuit as defined in claims 3 or 4 wherein said field effect transistor is of the implanted type.

10. A start-up circuit as defined in claim 1, wherein said resistor means comprises:

a passive resistor having a value of the pinch-off voltage of said field effect transistor means divided by the value of said related current when said regenerative feedback has raised said bias current level to said nonzero value.

11. A start-up circuit as defined in claim 10 wherein said resistor means comprises a base resistor.

12. A start-up circuit as defined in claim 10, wherein said resistor means comprises a base pinch resistor on an integrated circuit die.

13. A start-up circuit as defined in claim 10, wherein said resistor means comprises an epitaxial resistor on an integrated circuit die.

14. A start-up circuit as defined in claim 10, wherein said resistor means comprises an epitaxial pinch resistor on an integrated circuit die.

15. A start-up circuit as defined in claim 10, wherein said resistor means comprises a thin film resistor.

16. A start-up circuit for self-biased circuits of the type connected to supply voltages and having biasing currents stable at two operating points at which said biasing currents are either zero or nonzero in value when said supply voltage is nonzero, and having sufficient regenerative feedback to raise the level of said biasing currents to said nonzero value when an initial current is provided to said circuit, said start-up circuit comprising:

resistor means, connected between said supply voltage and said self-biased circuit, for providing a current path from said supply voltage to said self-biased circuit, and field effect transistor means, connected to said resistor means and to said self-biased circuit and responsive to the current flow through said path, for supplying an initial current to said self-biased circuit, whereupon said regenerative feedback causes said circuit to draw a current related to said biasing currents through said current path as said biasing currents reach said nonzero operating level, said flow of said related current causing said field effect transistor means to disconnect said initial current from said self-biased circuit as said nonzero operating level is reached, said start-up circuit drawing no power from said voltage supply after said disconnection.

17. A start-up circuit as defined in claim 16 wherein said field effect transistor means comprises:

a field effect transistor, including a gate terminal connected to said supply voltage, a source terminal coupled through said resistor means to said supply voltage and also connected to said self-biased circuit, and a drain terminal connected to said circuit, said transistor being initially biased in the ON state, whereby said initial current flows through the channel of said transistor to said self-biased circuit, said flow of said related current biasing said transistor to the OFF state and effecting said disconnection.

18. A start-up circuit as defined in claim 17, wherein said resistor means comprises:

a resistor having a value defined by the pinch-off voltage of said transistor divided by the value of said related current when said biasing currents have reached said nonzero operating point.

19. A start-up circuit as defined in claim 18, wherein said resistor means comprises a passive resistor.

20. A start-up circuit as defined in claim 17 wherein said transistor comprises a junction field effect transistor.

21. A start-up circuit as defined in claim 17 wherein said transistor comprises a metal-oxide-semiconductor field effect transistor.

* * * * *